(12) United States Patent
Kim et al.

(10) Patent No.: US 8,055,976 B2
(45) Date of Patent: Nov. 8, 2011

(54) SYSTEM AND METHOD FOR PROVIDING ERROR CORRECTION AND DETECTION IN A MEMORY SYSTEM

(75) Inventors: Kyu-hyoun Kim, Mount Kisco, NY (US); Paul W. Coteus, Yorktown Heights, NY (US); Luis A. Lastras-Montano, Cortlandt Manor, NY (US)

(73) Assignee: International Business Machines Corporation, Armonk, NY (US)

( * ) Notice: Subject to any disclaimer, the term of this patent is extended or adjusted under 35 U.S.C. 154(b) by 1119 days.

(21) Appl. No.: 11/837,785

(22) Filed: Aug. 13, 2007

(65) Prior Publication Data
US 2009/0049365 A1     Feb. 19, 2009

(51) Int. Cl.
*H03M 13/00* (2006.01)

(52) U.S. Cl. .................. 714/758; 714/752; 714/701

(58) Field of Classification Search ............. 365/233.13; 714/701, 752, 758
See application file for complete search history.

(56) References Cited

U.S. PATENT DOCUMENTS

| | | | |
|---|---|---|---|
| 5,313,464 A * | 5/1994 | Reiff | 714/701 |
| 5,513,135 A | 4/1996 | Dell et al. | |
| 6,381,685 B2 | 4/2002 | Dell et al. | |
| 2006/0036826 A1 * | 2/2006 | Dell et al. | 711/167 |

* cited by examiner

*Primary Examiner* — Sam Rizk
(74) *Attorney, Agent, or Firm* — Cantor Colburn LLP (57) ABSTRACT

A system and method for providing error correction and detection in a memory system. The memory system includes a plurality of memory devices, and error detection and correction logic. The error detection and correction logic includes instructions for generating an error correction code (ECC) word that includes bits from two more of the memory devices and from different memory device transfers.

20 Claims, 4 Drawing Sheets

SYSTEM AND METHOD FOR PROVIDING ERROR CORRECTION AND DETECTION IN A MEMORY SYSTEM

BACKGROUND OF THE INVENTION

This invention relates generally to computer memory, and more particularly to providing error correction and detection in a memory system.

Contemporary high performance computing main memory systems utilize error correction codes (ECCs) to detect and correct occasional, random bit errors.

Historically, for memory devices up through double data rate three (DDR3), most memory errors in a memory subsystem or system could be classified as being related to one or more of memory cell faults (generally affecting a single bit), memory core errors (e.g. word line or bit line errors affecting multiple bits, etc.), I/O errors (affecting one I/O of a device), "chip kills" (affecting all I/Os of a device) or other faults due to interconnect or interface device faults, etc. Bit error rates due solely to I/O transfer failure (e.g. the inability to pass data between the memory device and the device to which the memory device is connected) was almost zero in a properly designed and tuned (e.g. proper driver strengths, terminations, wiring topologies, etc) system.

With the increased data rates that are expected with emerging technologies (such as DDR4 and beyond), the very high data rates are expected to result in a dramatic increase in failure rates due to the inability of the memory device to accurately communicate with the device(s) (e.g., a memory interface device or "MID") to which it is attached, given the reduced timing margins present at the high data rates. These new errors will be caused by several factors such as clock jitter, inter symbol interference (ISI), cross-talk (between adjacent and otherwise nearby lines), etc. Of those listed, clock jitter is expected to be a major component in the increased failure rates, comprising almost half of the total failure rate.

The referenced clock jitter simultaneously affects a multitude of devices which may be transferring data at the same time. As such, the bit error rate (BER) of the devices that are simultaneously transferring data has a much higher correlation than traditional memory device faults (cell, core, etc.), which are generally random in nature. For this reason, the existence of a communication interface fault, at a given point in time in a high speed memory interface, suggests that there is a high probability that one or more other pins that are simultaneously switching may also have an error at the same time. Further compounding the situation is the likelihood that the number of errors (e.g. including at least three or more independent errors) will exceed the capability of contemporary/available ECC schemes which are developed to detect random errors that have almost zero correlation between different pins or different devices.

One method of addressing this concern is through the use of a cyclic redundancy check (CRC) coding, however, this solution requires additional pins (adding cost overhead) and may dramatically affect overall memory performance due to the need to initiate one or more re-try operations until a successful transfer is completed. Unlike ECC, a CRC method does not result in real-time error correction. CRC results in only error detection.

Therefore, it is highly desirable to have an ECC coding structure and method to maximize coverage for multiple bit errors, such as those that will be present with the future high speed memory device interfaces, such that performance and reliability can be maximized with minimal pincount overhead.

BRIEF SUMMARY OF THE INVENTION

An exemplary embodiment is a memory system including a plurality of memory devices, and error detection and correction logic. The error detection and correction logic includes instructions for generating an error correction code (ECC) word that includes bits from two more of the memory devices and from different memory device transfers.

Another exemplary embodiment is a memory controller operable with a plurality of memory devices. The memory controller includes logic for facilitating writing data to the memory devices over more than one transfer. The logic also facilitates reading data from the memory devices over more than one transfer. Error detection and correction is also facilitated, with the memory controller utilizing bits from different memory devices and different memory device transfers to form an ECC word.

A further exemplary embodiment is a method for reducing the probability of uncorrectable and undetectable faults in a memory system. The method includes applying an ECC across multiple memory devices having multiple transfers. An ECC word is constructed such that a different memory device transfer is utilized from a plurality of the memory devices to construct the ECC word.

Other systems, methods, and/or computer program products according to embodiments will be or become apparent to one with skill in the art upon review of the following drawings and detailed description. It is intended that all such additional systems, methods, and/or computer program products be included within this description, be within the scope of the present invention, and be protected by the accompanying claims.

BRIEF DESCRIPTION OF THE DRAWINGS

Referring now to the drawings wherein like elements are numbered alike in the several FIGURES.

DETAILED DESCRIPTION OF EXEMPLARY EMBODIMENTS

The invention relates to error correction codes (ECCs) and a manner of mapping an ECC in a high-speed memory system comprised of multiple memory devices.

Figure 1:
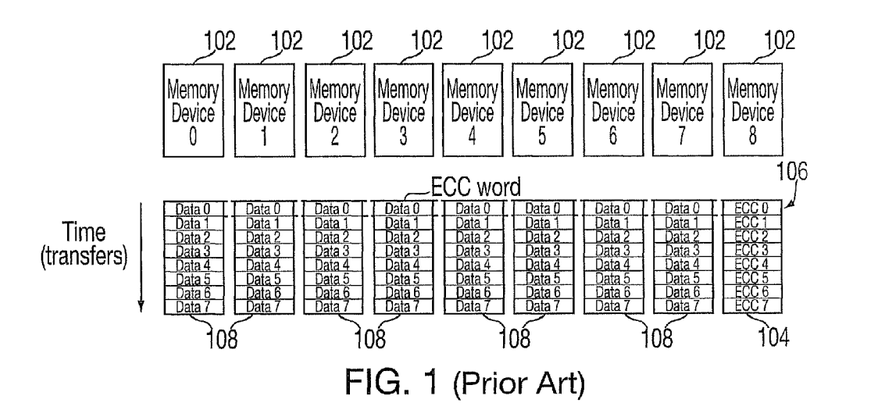
FIG. 1 depicts an example of a conventional ECC code word mapping.

FIG. 1 is an example of a conventional ECC word mapping, where the ECC is applied and calculated for data in the same transfer (beat). FIG. 1 depicts nine memory devices 102, a data access with a burst of eight including data bits 108 and ECC bits 104, and an ECC code word 106 that spans a single transfer. If there is a strong correlation between bit errors across different devices during the same transfer (as described earlier), this method will result in a high likelihood that the available ECC will be unable to correct, or even detect (due to the limited strength of the ECC in detecting multiple errors) the existence of the multiple errors, which may result in uncorrectable or even undetectable errors. At a minimum this results in a system failure, at a maximum this results in data corruption that is not detected by the system. As such, the contemporary solution may not be viable for future high speed memory interfaces having very small data eyes (e.g. data valid windows) due to the narrow data pulse width in conjunction with the aforementioned factors, including clock jitter.

Figure 2:
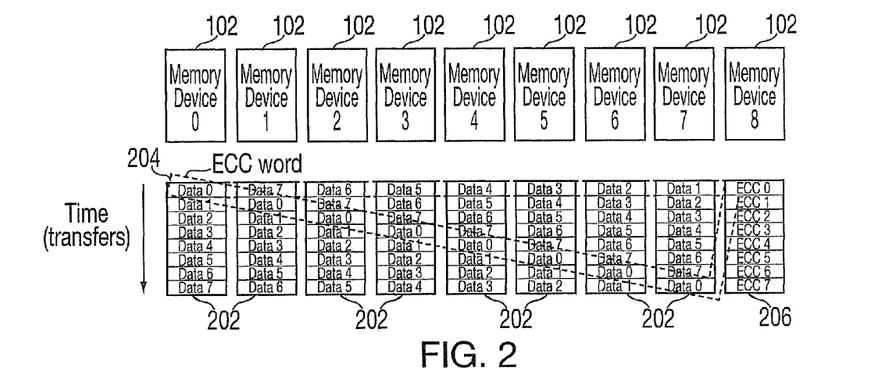
FIG. 2 depicts an exemplary split ECC symbol code word mapping that may be implemented by exemplary embodiments.

FIG. 2 depicts an exemplary split ECC symbol code word mapping that may be implemented by exemplary embodiments. FIG. 2 depicts nine memory devices 102, a data access with a burst of eight including data bits 202 and ECC bits 206, and an ECC code word 204 that spans several transfers. FIG. 2 shows a first exemplary ECC code word mapping which splits data bytes such that a given memory device of data width "n" and having a burst length of "x" (shown in this example as a burst length of 8 but could be 4, 16, or more) will construct the ECC word using data from a different transfer (e.g. transfer 0, 1, 2 . . . 7) for each of the memory devices. This results in an ECC word that does not include more than one symbol from the same transfer. Depending on such design/application elements as the data width of the memory device (e.g. 1 bit, 2 bits, 4 bits, 8 bits, etc), the selected ECC code, the memory data rate, etc, alternate exemplary embodiments may include more than one simultaneous (or nearly simultaneous) memory device transfer to construct an ECC word.

With the exemplary embodiment depicted in FIG. 2, even if all bytes (comprised of data transfers from the memory devices) are erroneous on a given transfer, every ECC code word would include, at maximum, one or two symbol errors (e.g. if both Data 0 and ECC 0 transfers are faulty), which are correctable and/or detectable by available ECC codes. Using this method, an unrecoverable failure can be avoided in the presence of highly correlative horizontal I/O errors (e.g. faults within a given transfer) without the need for costly and performance degrading CRC.

As is evident in FIG. 2, longer burst lengths (e.g. 16 or 32) will further benefit the exemplary solution, by ensuring that multiple faults taking place simultaneously (e.g. due to random/excessive clock jitter) will not result in more than a single symbol fault within an ECC word.

As is also shown in FIG. 2, via the numerical labeling of the data transfers from each memory device (e.g. Data 0 through Data 7), the exemplary embodiment will further address the need for the memory interface device, memory controller, processor or other interface device that writes and reads the memory to apply the ECC code across different transfers. Although only a single ECC word is shown, which starts with transfer 0 of memory device 0, a second ECC word, in the exemplary embodiment, would follow the same diagonal pattern but start with Data 1, etc. Alternate exemplary embodiments may utilize different mixes of transfers (e.g. an opposing diagonal line), without straying from the invention. In the exemplary embodiment depicted in FIG. 2, the memory device(s) 102 would not be directly affected by the method by which the ECC is applied in the memory subsystem/system. However, other exemplary embodiments might include notification, to the memory device 102, of the ECC application, thereby further enhancing error identification, fault recovery, or other reliability/availability/serviceability (RAS) features of the memory system.

Figure 3:
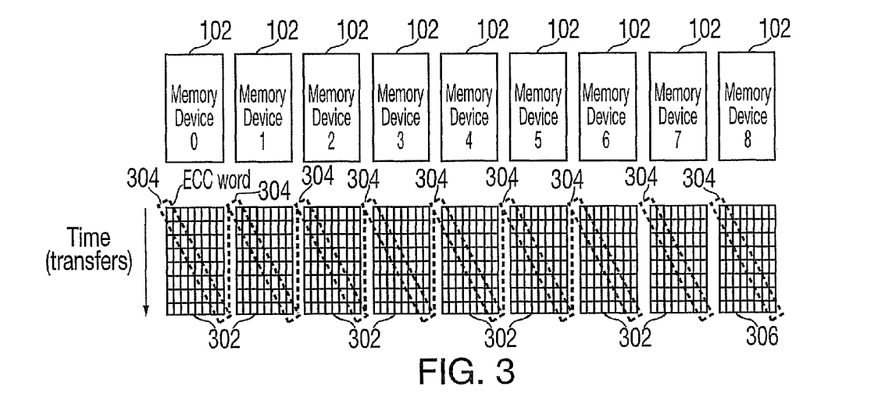
FIG. 3 depicts an exemplary split ECC symbol code word mapping that may be implemented by exemplary embodiments.

FIG. 3 depicts an alternate exemplary split ECC symbol code word mapping that may be implemented by exemplary embodiments. FIG. 3 depicts nine memory devices 102, a data access with a burst of eight including data bits 302 and ECC bits 306, and ECC code words 304 that span several transfers. FIG. 3 describes an alternate exemplary embodiment, similar in concept to FIG. 2, except in this case, bits within a same ECC symbol are split over time (multiple transfers from a single memory device 102). This solution may be optimal for alternate/emerging ECC environments, narrow memory interfaces and/or other emerging applications.

Figure 4:
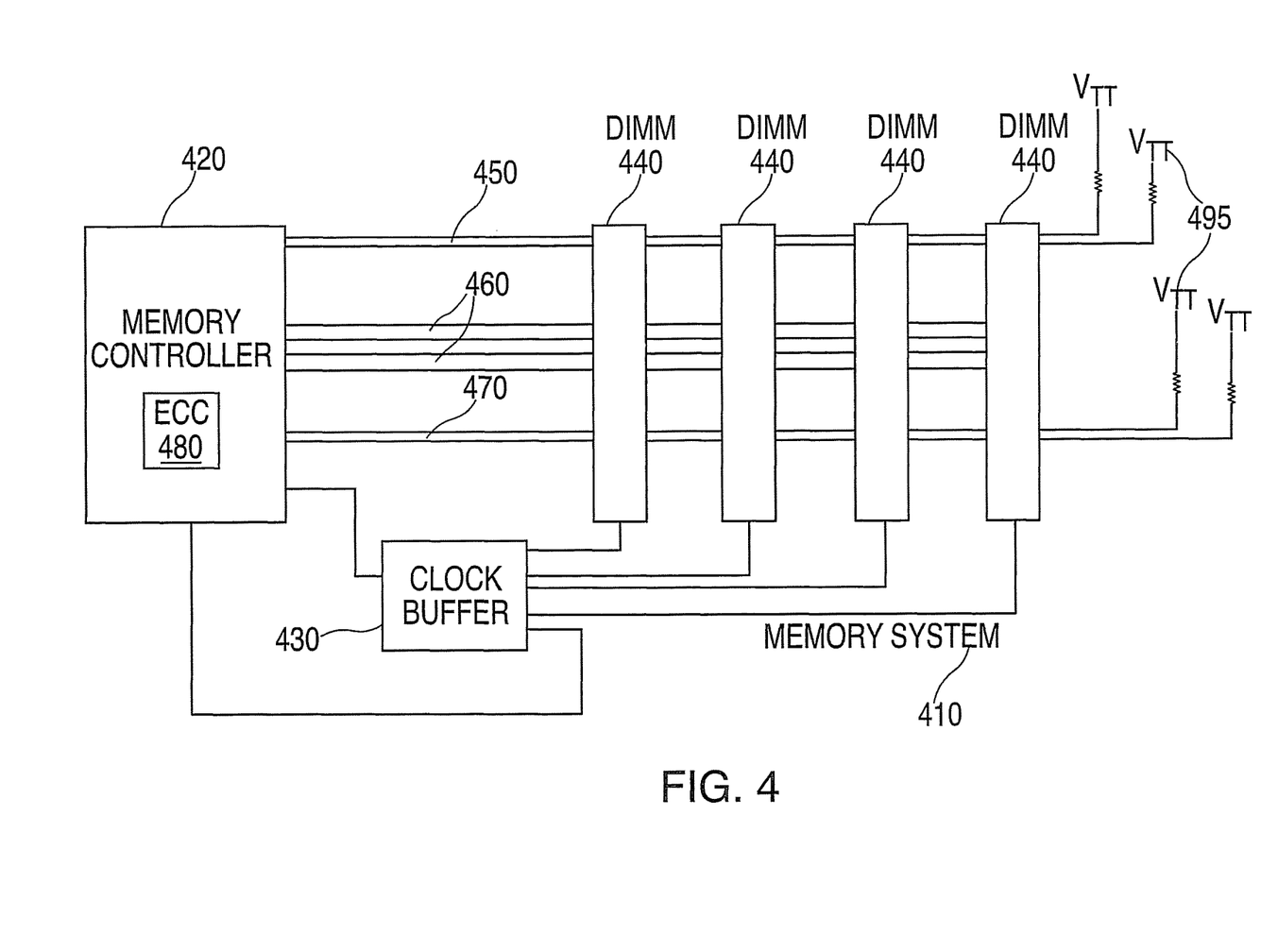
FIG. 4 depicts a memory system that includes DIMMs on a traditional multi-drop stub bus and that utilizes a split ECC symbol.

FIG. 4 depicts a simplified diagram and description of a memory system 410 that includes up to four registered DIMMs 440 on a traditional multi-drop stub bus. The system includes a memory controller 420, an external clock buffer 430, registered DIMMs 440, an address bus 450, a control bus 460 and a data bus 470 with terminators 495 on the address bus 450 and the data bus 470. The memory controller 420 includes the use of a split ECC symbol as described herein in reference to FIGS. 2 and 3. In an alternate exemplary embodiment, the split ECC symbol is utilized in one or both of the DIMMs 340 and the memory controller 420. The split ECC symbol and the associated logic to perform error correction and detection using the split ECC symbol is denoted ECC 480 in FIG. 4 (it is also referred to herein as error detection and correction logic). The ECC 480 may be implemented by hardware and/or software. Although only a single memory channel is shown in FIG. 4, systems produced with these modules often included more than one discrete memory channel from the memory controller, with each of the memory channels operated singly (when a single channel was populated with modules) or in parallel (when two or more channels where populated with modules) to achieve the desired system functionality and/or performance.

Figure 5:
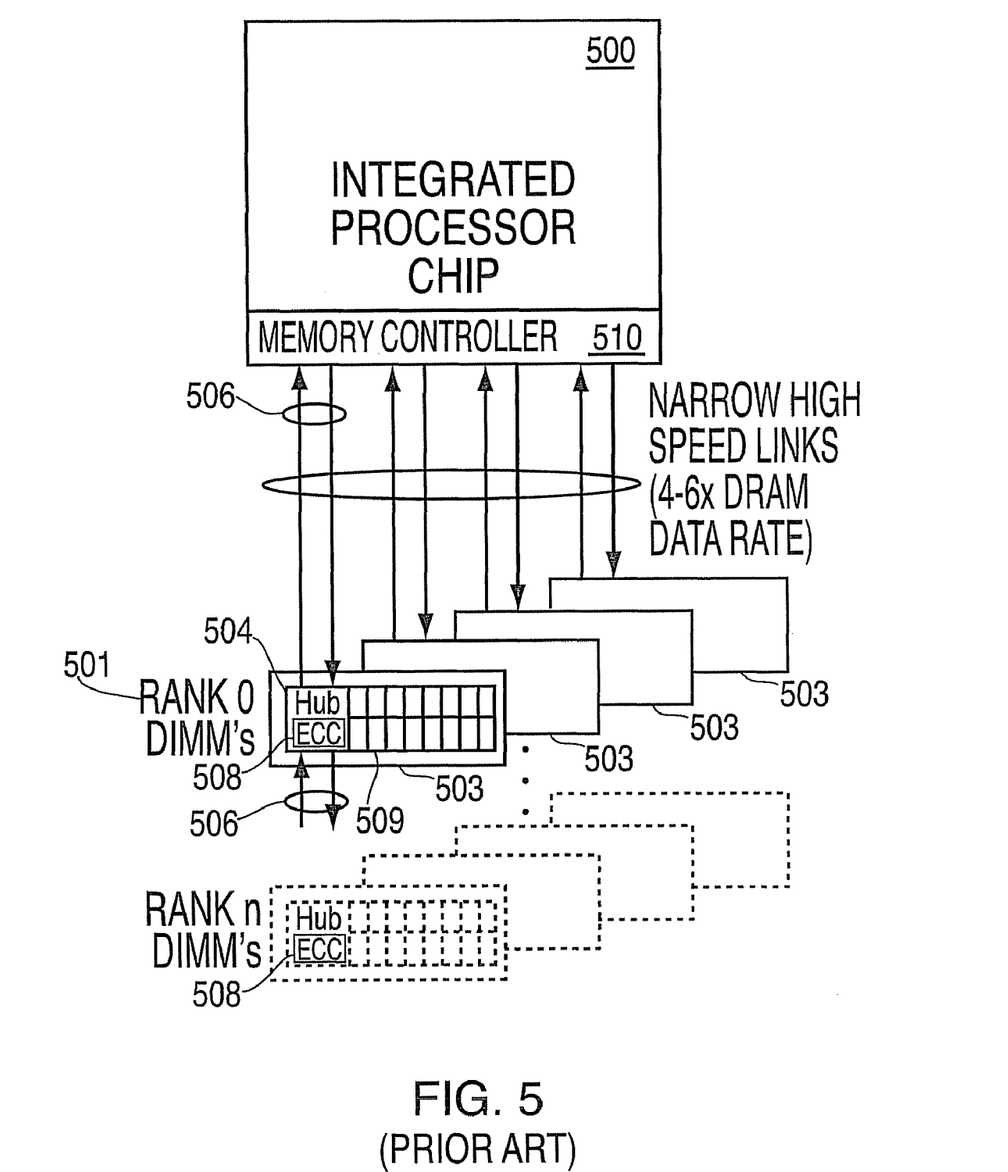
FIG. 5 depicts a cascade interconnect memory system with unidirectional busses that utilizes a split ECC symbol.

FIG. 5 depicts a contemporary system composed of an integrated processor chip 500, which contains one or more processor elements and an integrated memory controller 510. In the configuration depicted in FIG. 5, multiple independent cascade interconnected memory interface busses 506 are logically aggregated together to operate in unison to support a single independent access request at a higher bandwidth with data and error detection/correction information distributed or "striped" across the parallel busses and associated devices. The memory controller 510 attaches to four narrow/high speed point-to-point memory busses 506, with each bus 506 connecting one of the several unique memory controller interface channels to a cascade interconnect memory subsystem 503 (or memory module) which includes at least a hub device 606 (or memory interface device) and one or more memory devices 509. Some systems further enable operations when a subset of the memory busses 506 are populated with memory subsystems 503. In this case, the one or more populated memory busses 508 may operate in unison to support a single access request. As depicted in FIG. 5, the hub device 508 includes the use of a split ECC symbol as described herein in reference to FIGS. 2 and 3. The split ECC symbol and the associated logic to perform error correction and detection using the split ECC symbol is denoted ECC 508 in FIG. 5 (it is also referred to herein as error detection and correction logic). The ECC 508 may be implemented by hardware and/or software.

Figure 6:
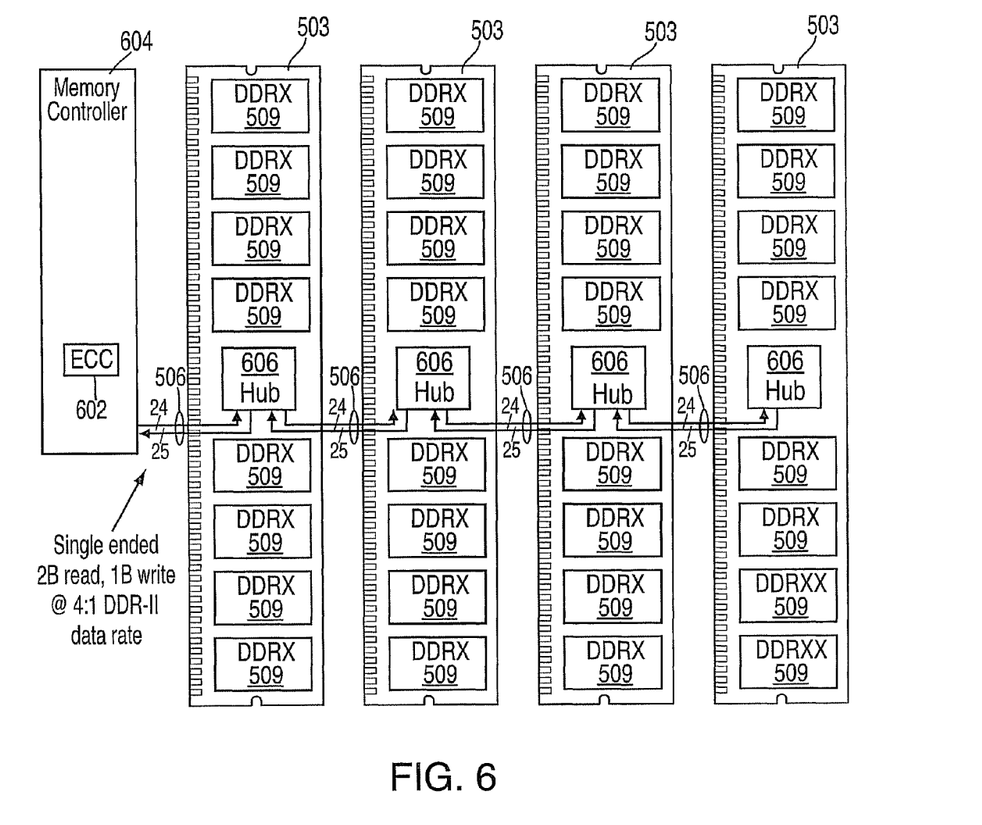
FIG. 6 depicts a cascade interconnect memory system with unidirectional busses that utilizes a split ECC symbol.

FIG. 6 depicts a memory structure with cascaded memory modules 503 and unidirectional busses 506. One of the functions provided by the hub devices 504 in the memory modules 503 in the cascade structure is a re-drive function to send signals on the unidirectional busses 506 to other memory modules 503 or to the memory controller 510. FIG. 6 includes the memory controller 510 and four memory modules 503, on each of two memory busses 506 (a downstream memory bus with 24 wires and an upstream memory bus with 25 wires), connected to the memory controller 510 in either a direct or cascaded manner. The memory module 503 next to the memory controller 510 is connected to the memory controller 510 in a direct manner. The other memory modules 503 are connected to the memory controller 510 in a cascaded manner. Although not shown in this figure, the memory controller 510 may be integrated in the processor 500 and may connect to more than one memory bus 506 as depicted in FIG. 5. As depicted in FIG. 6, the memory controller 604 includes the use of a split ECC symbol as described herein in reference to FIGS. 2 and 3. The split ECC symbol and the associated logic to perform error correction and detection using the split ECC symbol is denoted ECC 602 in FIG. 6 (it is also referred to herein as error detection and correction logic). The ECC 602 may be implemented by hardware and/or software.

The capabilities of the present invention can be implemented in software, firmware, hardware or some combination thereof.

As one example, one or more aspects of the present invention can be included in an article of manufacture (e.g., one or more computer program products) having, for instance, computer usable media. The media has embodied therein, for instance, computer readable program code means for providing and facilitating the capabilities of the present invention. The article of manufacture can be included as a part of a computer system or sold separately.

Additionally, at least one program storage device readable by a machine, tangibly embodying at least one program of instructions executable by the machine to perform the capabilities of the present invention can be provided.

The diagrams depicted herein are just examples. There may be many variations to these diagrams or the steps (or operations) described therein without departing from the spirit of the invention. For instance, the steps may be performed in a differing order, or steps may be added, deleted or modified. All of these variations are considered a part of the claimed invention.

Exemplary embodiments include a computing system with a processor(s) and an I/O unit(s) (e.g., requesters) interconnected to a memory system that contains a memory controller and memory devices. In exemplary embodiments, the memory system includes a processor or memory controller interfaced to a set of hub devices (also referred to as "hub chips"). The hub devices connect and interface to the memory devices via signals which include clock signals. In exemplary embodiments the computer memory system includes a physical memory array with a plurality of memory devices for storing data and instructions. These memory devices may be connected directly to the memory controller and/or indirectly coupled to the memory controller through hub devices. In exemplary embodiments, the hub-based computer memory system has memory devices attached to a communication hub device that is connected to a memory control device (e.g., a memory controller). Also in exemplary embodiments, the hub device is located on a memory module (e.g., a single substrate or physical device) that includes two or more hub devices that are cascaded interconnected to each other (and possibly to another hub device located on another memory module) via the memory bus.

Hub devices may be connected to the memory controller through a multi-drop or point-to-point bus structure (which may further include a cascade connection to one or more additional hub devices). Memory access requests are transmitted by the memory controller through the bus structure (e.g., the memory bus) to the selected hub(s). In response to receiving the memory access requests, the hub device translates the memory access requests to control the memory devices to store write data from the hub device or to provide read data to the hub device. Read data is encoded into one or more communication packet(s) and transmitted through the memory bus(ses) to the memory controller.

In alternate exemplary embodiments, the memory controller(s) may be integrated together with one or more processor chips and supporting logic, packaged in a discrete chip (commonly called a "northbridge" chip), included in a multi-chip carrier with the one or more processors and/or supporting logic, or packaged in various alternative forms that best match the application/environment. Any of these solutions may or may not employ one or more narrow/high speed links to connect to one or more hub chips and/or memory devices.

The memory modules may be implemented by a variety of technology including a DIMM, a single in-line memory module (SIMM) and/or other memory module or card structures. In general, a DIMM refers to a small circuit board which is comprised primarily of random access memory (RAM) integrated circuits or die on one or both sides with signal and/or power pins on both sides of the board. This can be contrasted to a SIMM which is a small circuit board or substrate composed primarily of RAM integrated circuits or die on one or both sides and single row of pins along one long edge. DIMMs have been constructed with pincounts ranging from 100 pins to over 300 pins. In exemplary embodiments described herein, memory modules may include two or more hub devices.

In exemplary embodiments, the memory bus is constructed using multi-drop connections to hub devices on the memory modules and/or using point-to-point connections. The downstream portion of the controller interface (or memory bus), referred to as the downstream bus, may include command, address, data and other operational, initialization or status information being sent to the hub devices on the memory modules. Each hub device may simply forward the information to the subsequent hub device(s) via bypass circuitry; receive, interpret and re-drive the information if it is determined to be targeting a downstream hub device; re-drive some or all of the information without first interpreting the information to determine the intended recipient; or perform a subset or combination of these options.

The upstream portion of the memory bus, referred to as the upstream bus, returns requested read data and/or error, status or other operational information, and this information may be forwarded to the subsequent hub devices via bypass circuitry; be received, interpreted and re-driven if it is determined to be targeting an upstream hub device and/or memory controller in the processor complex; be re-driven in part or in total without first interpreting the information to determine the intended recipient; or perform a subset or combination of these options.

In alternate exemplary embodiments, the point-to-point bus includes a switch or bypass mechanism which results in the bus information being directed to one of two or more possible hub devices during downstream communication (communication passing from the memory controller to a hub device on a memory module), as well as directing upstream information (communication from a hub device on a memory module to the memory controller), often by way of one or more upstream hub devices. Further embodiments include the use of continuity modules, such as those recognized in the art, which, for example, can be placed between the memory controller and a first populated hub device (i.e., a hub device that is in communication with one or more memory devices), in a cascade interconnect memory system, such that any intermediate hub device positions between the memory controller and the first populated hub device include a means by which information passing between the memory controller and the first populated hub device can be received even if the one or more intermediate hub device position(s) do not include a hub device. The continuity module(s) may be installed in any module position(s), subject to any bus restrictions, including the first position (closest to the main memory controller, the last position (prior to any included termination) or any intermediate position(s). The use of continuity modules may be especially beneficial in a multi-module cascade interconnect bus structure, where an intermediate hub device on a memory module is removed and replaced by a continuity module, such that the system continues to operate after the removal of the intermediate hub device. In more common embodiments, the continuity module(s) would include either interconnect wires to transfer all required signals from the input(s) to the corresponding output(s), or be re-driven through a repeater device. The continuity module(s) might further include a non-volatile storage device (such as an EEPROM), but would not include main memory storage devices.

In exemplary embodiments, the memory system includes one or more hub devices on one or more memory modules connected to the memory controller via a cascade interconnect memory bus, however other memory structures may be implemented such as a point-to-point bus, a multi-drop memory bus or a shared bus. Depending on the signaling methods used, the target operating frequencies, space, power, cost, and other constraints, various alternate bus structures may be considered. A point-to-point bus may provide the optimal performance in systems produced with electrical interconnections, due to the reduced signal degradation that may occur as compared to bus structures having branched signal lines, switch devices, or stubs. However, when used in systems requiring communication with multiple devices or subsystems, this method will often result in significant added component cost and increased system power, and may reduce the potential memory density due to the need for intermediate buffering and/or re-drive.

Although not shown in the Figures, the memory modules or hub devices may also include a separate bus, such as a 'presence detect' bus, an I2C bus and/or an SMBus which is used for one or more purposes including the determination of the hub device an/or memory module attributes (generally after power-up), the reporting of fault or status information to the system, the configuration of the hub device(s) and/or memory subsystem(s) after power-up or during normal operation or other purposes. Depending on the bus characteristics, this bus might also provide a means by which the valid completion of operations could be reported by the hub devices and/or memory module(s) to the memory controller(s), or the identification of failures occurring during the execution of the main memory controller requests.

Performances similar to those obtained from point-to-point bus structures can be obtained by adding switch devices. These and other solutions offer increased memory packaging density at lower power, while retaining many of the characteristics of a point-to-point bus. Multi-drop busses provide an alternate solution, albeit often limited to a lower operating frequency, but at a cost/performance point that may be advantageous for many applications. Optical bus solutions permit significantly increased frequency and bandwidth potential, either in point-to-point or multi-drop applications, but may incur cost and space impacts.

As used herein the term "buffer" or "buffer device" refers to a temporary storage unit (as in a computer), especially one that accepts information at one rate and delivers it another. In exemplary embodiments, a buffer is an electronic device that provides compatibility between two signals (e.g., changing voltage levels or current capability). The term "hub" is sometimes used interchangeably with the term "buffer." A hub is a device containing multiple ports that is connected to several other devices. A port is a portion of an interface that serves a congruent I/O functionality (e.g., a port may be utilized for sending and receiving data, address, and control information over one of the point-to-point links, or busses). A hub may be a central device that connects several systems, subsystems, or networks together. A passive hub may simply forward messages, while an active hub, or repeater, amplifies and refreshes the stream of data which otherwise would deteriorate over a distance. The term hub device, as used herein, refers to a hub chip that includes logic (hardware and/or software) for performing memory functions.

Also as used herein, the term "bus" refers to one of the sets of conductors (e.g., wires, and printed circuit board traces or connections in an integrated circuit) connecting two or more functional units in a computer. The data bus, address bus and control signals, despite their names, constitute a single bus since each are often useless without the others. A bus may include a plurality of signal lines, each signal line having two or more connection points, that form a main transmission path that electrically connects two or more transceivers, transmitters and/or receivers. The term "bus" is contrasted with the term "channel" which is often used to describe the function of a "port" as related to a memory controller in a memory system, and which may include one or more busses or sets of busses. The term "channel" as used herein refers to a port on a memory controller. Note that this term is often used in conjunction with I/O or other peripheral equipment, however the term channel has been adopted by some to describe the interface between a processor or memory controller and one of one or more memory subsystem(s).

Further, as used herein, the term "daisy chain" refers to a bus wiring structure in which, for example, device A is wired to device B, device B is wired to device C, etc. The last device is typically wired to a resistor or terminator. All devices may receive identical signals or, in contrast to a simple bus, each device may modify one or more signals before passing them on. A "cascade" or cascade interconnect' as used herein refers to a succession of stages or units or a collection of interconnected networking devices, typically hubs, in which the hubs operate as a logical repeater, further permitting merging data to be concentrated into the existing data stream. Also as used herein, the term "point-to-point" bus and/or link refers to one or a plurality of signal lines that may each include one or more terminators. In a point-to-point bus and/or link, each signal line has two transceiver connection points, with each transceiver connection point coupled to transmitter circuitry, receiver circuitry or transceiver circuitry. A signal line refers to one or more electrical conductors or optical carriers, generally configured as a single carrier or as two or more carriers, in a twisted, parallel, or concentric arrangement, used to transport at least one logical signal.

Memory devices are generally defined as integrated circuits that are composed primarily of memory (storage) cells, such as DRAMs (Dynamic Random Access Memories), SRAMs (Static Random Access Memories), FeRAMs (Ferro-Electric RAMs), MRAMs (Magnetic Random Access Memories), Flash Memory and other forms of random access and related memories that store information in the form of electrical, optical, magnetic, biological or other means. Dynamic memory device types may include asynchronous memory devices such as FPM DRAMs (Fast Page Mode Dynamic Random Access Memories), EDO (Extended Data Out) DRAMs, BEDO (Burst EDO) DRAMs, SDR (Single Data Rate) Synchronous DRAMs, DDR (Double Data Rate) Synchronous DRAMs or any of the expected follow-on devices such as DDR2, DDR3, DDR4 and related technologies such as Graphics RAMs, Video RAMs, LP RAM (Low Power DRAMs) which are often based on the fundamental functions, features and/or interfaces found on related DRAMs.

Memory devices may be utilized in the form of chips (die) and/or single or multi-chip packages of various types and configurations. In multi-chip packages, the memory devices may be packaged with other device types such as other memory devices, logic chips, analog devices and programmable devices, and may also include passive devices such as resistors, capacitors and inductors. These packages may include an integrated heat sink or other cooling enhancements, which may be further attached to the immediate carrier or another nearby carrier or heat removal system.

Module support devices (such as buffers, hubs, hub logic chips, registers, PLL's, DLL's, non-volatile memory, etc) may be comprised of multiple separate chips and/or components, may be combined as multiple separate chips onto one or more substrates, may be combined onto a single package or even integrated onto a single device—based on technology, power, space, cost and other tradeoffs. In addition, one or more of the various passive devices such as resistors, capacitors may be integrated into the support chip packages, or into the substrate, board or raw card itself, based on technology, power, space, cost and other tradeoffs. These packages may include an integrated heat sink or other cooling enhancements, which may be further attached to the immediate carrier or another nearby carrier or heat removal system.

Memory devices, hubs, buffers, registers, clock devices, passives and other memory support devices and/or components may be attached to the memory subsystem and/or hub device via various methods including solder interconnects, conductive adhesives, socket structures, pressure contacts and other methods which enable communication between the two or more devices via electrical, optical or alternate means.

The one or more memory modules (or memory subsystems) and/or hub devices may be electrically connected to the memory system, processor complex, computer system or other system environment via one or more methods such as soldered interconnects, connectors, pressure contacts, conductive adhesives, optical interconnects and other communication and power delivery methods. Connector systems may include mating connectors (male/female), conductive contacts and/or pins on one carrier mating with a male or female connector, optical connections, pressure contacts (often in conjunction with a retaining mechanism) and/or one or more of various other communication and power delivery methods. The interconnection(s) may be disposed along one or more edges of the memory assembly and/or placed a distance from an edge of the memory subsystem depending on such application requirements as ease-of-upgrade/repair, available space/volume, heat transfer, component size and shape and other related physical, electrical, optical, visual/physical access, etc. Electrical interconnections on a memory module are often referred to as contacts, or pins, or tabs. Electrical interconnections on a connector are often referred to as contacts or pins.

As used herein, the term memory subsystem refers to, but is not limited to: one or more memory devices; one or more memory devices and associated interface and/or timing/control circuitry; and/or one or more memory devices in conjunction with a memory buffer, hub device, and/or switch. The term memory subsystem may also refer to one or more memory devices, in addition to any associated interface and/or timing/control circuitry and/or a memory buffer, hub device or switch, assembled into a substrate, a card, a module or related assembly, which may also include a connector or similar means of electrically attaching the memory subsystem with other circuitry. The memory modules described herein may also be referred to as memory subsystems because they include one or more memory devices and hub devices Additional functions that may reside local to the memory subsystem and/or hub device include write and/or read buffers, one or more levels of memory cache, local pre-fetch logic, data encryption/decryption, compression/decompression, protocol translation, command prioritization logic, voltage and/or level translation, error detection and/or correction circuitry, data scrubbing, local power management circuitry and/or reporting, operational and/or status registers, initialization circuitry, performance monitoring and/or control, one or more co-processors, search engine(s) and other functions that may have previously resided in other memory subsystems. By placing a function local to the memory subsystem, added performance may be obtained as related to the specific function, often while making use of unused circuits within the subsystem.

Memory subsystem support device(s) may be directly attached to the same substrate or assembly onto which the memory device(s) are attached, or may be mounted to a separate interposer or substrate also produced using one or more of various plastic, silicon, ceramic or other materials which include electrical, optical or other communication paths to functionally interconnect the support device(s) to the memory device(s) and/or to other elements of the memory or computer system.

Information transfers (e.g. packets) along a bus, channel, link or other naming convention applied to an interconnection method may be completed using one or more of many signaling options. These signaling options may include such methods as single-ended, differential, optical or other approaches, with electrical signaling further including such methods as voltage or current signaling using either single or multi-level approaches. Signals may also be modulated using such methods as time or frequency, non-return to zero, phase shift keying, amplitude modulation and others. Voltage levels are expected to continue to decrease, with 1.5V, 1.2V, 1V and lower signal voltages expected consistent with (but often independent of) the reduced power supply voltages required for the operation of the associated integrated circuits themselves.

One or more clocking methods may be utilized within the memory subsystem and the memory system itself, including global clocking, source-synchronous clocking, encoded clocking or combinations of these and other methods. The clock signaling may be identical to that of the signal lines themselves, or may utilize one of the listed or alternate methods that is more conducive to the planned clock frequency (ies), and the number of clocks planned within the various subsystems. A single clock may be associated with all communication to and from the memory, as well as all clocked functions within the memory subsystem, or multiple clocks may be sourced using one or more methods such as those described earlier. When multiple clocks are used, the functions within the memory subsystem may be associated with a clock that is uniquely sourced to the subsystem, or may be based on a clock that is derived from the clock related to the information being transferred to and from the memory subsystem (such as that associated with an encoded clock). Alternately, a unique clock may be used for the information transferred to the memory subsystem, and a separate clock for information sourced from one (or more) of the memory subsystems. The clocks themselves may operate at the same or frequency multiple of the communication or functional frequency, and may be edge-aligned, center-aligned or placed in an alternate timing position relative to the data, command or address information.

Information passing to the memory subsystem(s) will generally be composed of address, command and data, as well as other signals generally associated with requesting or reporting status or error conditions, resetting the memory, completing memory or logic initialization and other functional, configuration or related information. Information passing from the memory subsystem(s) may include any or all of the information passing to the memory subsystem(s), however generally will not include address and command information. This information may be communicated using communication methods that may be consistent with normal memory device interface specifications (generally parallel in nature), the information may be encoded into a 'packet' structure, which may be consistent with future memory interfaces or simply developed to increase communication bandwidth and/or enable the subsystem to operate independently of the memory technology by converting the received information into the format required by the receiving device(s).

Initialization of the memory subsystem may be completed via one or more methods, based on the available interface busses, the desired initialization speed, available space, cost/complexity objectives, subsystem interconnect structures, the use of alternate processors (such as a service processor) which may be used for this and other purposes, etc. In one embodiment, the high speed bus may be used to complete the initialization of the memory subsystem(s), generally by first completing a training process to establish reliable communication, then by interrogation of the attribute or 'presence detect' data associated the various components and/or characteristics associated with that subsystem, and ultimately by programming the appropriate devices with information associated with the intended operation within that system. In a cascaded system, communication with the first memory subsystem would generally be established, followed by subsequent (downstream) subsystems in the sequence consistent with their position along the cascade interconnect bus.

A second initialization method would include one in which the high speed bus is operated at one frequency during the initialization process, then at a second (and generally higher) frequency during the normal operation. In this embodiment, it may be possible to initiate communication with all of the memory subsystems on the cascade interconnect bus prior to completing the interrogation and/or programming of each subsystem, due to the increased timing margins associated with the lower frequency operation.

A third initialization method might include operation of the cascade interconnect bus at the normal operational frequency (ies), while increasing the number of cycles associated with each address, command and/or data transfer. In one embodiment, a packet containing all or a portion of the address, command and/or data information might be transferred in one clock cycle during normal operation, but the same amount and/or type of information might be transferred over two, three or more cycles during initialization. This initialization process would therefore be using a form of 'slow' commands, rather than 'normal' commands, and this mode might be automatically entered at some point after power-up and/or re-start by each of the subsystems and the memory controller by way of POR (power-on-reset) logic included in each of these subsystems.

A fourth initialization method might utilize a distinct bus, such as a presence detect bus (such as the one defined in U.S. Pat. No. 5,513,135 to Dell et al., of common assignment herewith), an I2C bus (such as defined in published JEDEC standards such as the 168 Pin DIMM family in publication 21-C revision 7R8) and/or the SMBUS, which has been widely utilized and documented in computer systems using such memory modules. This bus might be connected to one or more modules within a memory system in a daisy chain/cascade interconnect, multi-drop or alternate structure, providing an independent means of interrogating memory subsystems, programming each of the one or more memory subsystems to operate within the overall system environment, and adjusting the operational characteristics at other times during the normal system operation based on performance, thermal, configuration or other changes desired or detected in the system environment.

Other methods for initialization can also be used, in conjunction with or independent of those listed. The use of a separate bus, such as described in the fourth embodiment above, also offers the advantage of providing an independent means for both initialization and uses other than initialization, such as described in U.S. Pat. No. 6,381,685 to Dell et al., of common assignment herewith, including changes to the subsystem operational characteristics on-the-fly and for the reporting of and response to operational subsystem information such as utilization, temperature data, failure information or other purposes.

With improvements in lithography, better process controls, the use of materials with lower resistance, increased field sizes and other semiconductor processing improvements, increased device circuit density (often in conjunction with increased die sizes) will help facilitate increased function on integrated devices as well as the integration of functions previously implemented on separate devices. This integration will serve to improve overall performance of the intended function, as well as promote increased storage density, reduced power, reduced space requirements, lower cost and other manufacturer and customer benefits. This integration is a natural evolutionary process, and may result in the need for structural changes to the fundamental building blocks associated with systems.

The integrity of the communication path, the data storage contents and all functional operations associated with each element of a memory system or subsystem can be assured, to a high degree, with the use of one or more fault detection and/or correction methods. Any or all of the various elements may include error detection and/or correction methods such as CRC (Cyclic Redundancy Code), EDC (Error Detection and Correction), parity or other encoding/decoding methods suited for this purpose. Further reliability enhancements may include operation re-try (to overcome intermittent faults such as those associated with the transfer of information), the use of one or more alternate or replacement communication paths to replace failing paths and/or lines, complement-re-complement techniques or alternate methods used in computer, communication and related systems.

The use of bus termination, on busses as simple as point-to-point links or as complex as multi-drop structures, is becoming more common consistent with increased performance demands. A wide variety of termination methods can be identified and/or considered, and include the use of such devices as resistors, capacitors, inductors or any combination thereof, with these devices connected between the signal line and a power supply voltage or ground, a termination voltage or another signal. The termination device(s) may be part of a passive or active termination structure, and may reside in one or more positions along one or more of the signal lines, and/or as part of the transmitter and/or receiving device(s). The terminator may be selected to match the impedance of the transmission line, or selected via an alternate approach to maximize the useable frequency, operating margins and related attributes within the cost, space, power and other constraints.

Technical effects and benefits include the ability to maximize coverage for multiple bit errors.

As described above, the embodiments of the invention may be embodied in the form of computer-implemented processes and apparatuses for practicing those processes. Embodiments of the invention may also be embodied in the form of computer program code containing instructions embodied in tangible media, such as floppy diskettes, CD-ROMs, hard drives, or any other computer-readable storage medium, wherein, when the computer program code is loaded into and executed by a computer, the computer becomes an apparatus for practicing the invention. The present invention can also be embodied in the form of computer program code, for example, whether stored in a storage medium, loaded into and/or executed by a computer, or transmitted over some transmission medium, such as over electrical wiring or cabling, through fiber optics, or via electromagnetic radiation, wherein, when the computer program code is loaded into and executed by a computer, the computer becomes an apparatus for practicing the invention. When implemented on a general-purpose microprocessor, the computer program code segments configure the microprocessor to create specific logic circuits.

While the invention has been described with reference to exemplary embodiments, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims. Moreover, the use of the terms first, second, etc. do not denote any order or importance, but rather the terms first, second, etc. are used to distinguish one element from another.

What is claimed is:

1. A memory system comprising:
a plurality of memory devices; and
error detection and correction logic, including instructions for generating an error correction code (ECC) word comprised of bits from two more of the memory devices and from different memory device transfers.

2. The memory system of claim 1 further comprising a memory controller in communication with the memory devices, wherein the error detection and correction logic is located on the memory controller.

3. The memory system of claim 1 further comprising a hub device in communication with the memory devices, wherein the error detection and correction logic is located on the hub device.

4. The memory system of claim 1 wherein the memory devices are operable with a burst length of four, eight or sixteen.

5. The memory system of claim 1 wherein the memory devices are operable with a burst length of greater than sixteen.

6. The memory system of claim 1 further comprising a memory subsystem comprising the memory devices, wherein the data width of the memory subsystem is thirty-six bits or seventy-two bits or one hundred and forty-four bits.

7. The memory system of claim 1 wherein the error detection and correction logic detects faults and the transfers from two or more of the memory devices occurring at approximately the same point in time are utilized to construct the ECC word.

8. The memory system of claim 7 wherein the error detection and correction logic further corrects the faults.

9. The memory system of claim 1 wherein a burst length of the memory devices is such that two or more ECC words are constructed in a single burst, thereby permitting the error detection and correction logic to detect faults prior to the completion of all of the transfers in the burst.

10. The memory system of claim 9 wherein the error detection and correction logic further corrects the faults prior to the completion of all the transfers in the burst.

11. A memory controller operable with a plurality of memory devices, the memory controller including logic for facilitating:
writing data to the memory devices over more than one transfer;
reading data from the memory devices over more than one transfer; and
error detection and correction, wherein the memory controller utilizes bits from different memory devices and different memory device transfers to form an ECC word.

12. The memory controller of claim 11 wherein the memory devices are operable with a burst length of four, eight or sixteen.

13. The memory controller of claim 11 wherein the memory devices are operable with a burst length of greater than sixteen.

14. The memory controller of claim 11 wherein the memory devices are located in a memory subsystem and the data width of the memory subsystem is thirty-six bits or seventy-two bits or one hundred and forty-four bits.

15. The memory controller of claim 11 wherein the error detection and correction includes detecting faults and the transfers from two or more of the memory devices occurring at approximately the same point in time are utilized to construct the ECC word.

16. The memory controller of claim 15 wherein the error detection and correction further includes correcting the faults.

17. The memory controller of claim 11 wherein a burst length of the memory devices is such that two or more ECC words arc constructed from a single burst, thereby permitting the error detection and correction to detect faults prior to the completion of all of the transfers in the burst.

18. The memory controller of claim 17 wherein the error detection and correction further includes correcting the faults prior to the completion of all of the transfers in the burst.

19. A method for reducing the probability of uncorrectable and undetectable faults in a memory system, the method comprising:
applying an ECC across multiple memory devices having multiple transfers; and
constructing an ECC word such that a different memory device transfer is utilized from a plurality of the memory devices to construct the ECC word.

20. The method of claim 19 further comprising detecting a fault and correcting the fault.

* * * * *